(12) United States Patent
Handforth et al.

(10) Patent No.: US 6,876,085 B1
(45) Date of Patent: Apr. 5, 2005

(54) SIGNAL LAYER INTERCONNECT USING TAPERED TRACES

(75) Inventors: Martin R. Handforth, Kanata (CA); John J. Stankus, Plano, TX (US)

(73) Assignee: Nortel Networks Limited (CA)

( * ) Notice: Subject to any disclaimer, the term of this patent is extended or adjusted under 35 U.S.C. 154(b) by 0 days.

(21) Appl. No.: 10/139,982

(22) Filed: May 7, 2002

Related U.S. Application Data

(60) Provisional application No. 60/324,328, filed on Sep. 24, 2001.

(51) Int. Cl.[7] ............................ H01L 23/48; H01R 9/00; H01R 12/04
(52) U.S. Cl. ........................ 257/775; 257/776; 257/786; 361/774; 361/802; 174/261
(58) Field of Search ................................ 257/776, 773, 257/775, 786; 361/772, 774, 792, 802; 174/254–256, 260, 261

(56) References Cited

U.S. PATENT DOCUMENTS

| | | | | | |
|---|---|---|---|---|---|
| 4,000,558 | A | * | 1/1977 | Cahill | ........................ 29/850 |
| 4,261,042 | A | * | 4/1981 | Ishiwatari et al. | .......... 708/138 |
| 5,357,084 | A | * | 10/1994 | McKee et al. | .............. 219/605 |
| 5,656,507 | A | * | 8/1997 | Welbourn et al. | ............. 385/14 |
| 5,799,392 | A | * | 9/1998 | Mishiro | ....................... 29/830 |
| 6,101,099 | A | * | 8/2000 | Olsson | ....................... 361/761 |
| 6,226,862 | B1 | * | 5/2001 | Neuman | ...................... 29/830 |
| 6,444,923 | B1 | * | 9/2002 | Iriguchi et al. | ............. 174/261 |
| 6,469,255 | B2 | * | 10/2002 | Watanabe et al. | ........... 174/254 |
| 6,700,207 | B2 | * | 3/2004 | Pekin et al. | ................. 257/778 |

* cited by examiner

*Primary Examiner*—Alonzo Chambliss
(74) *Attorney, Agent, or Firm*—Steubing McGuinness & Manaras LLP

(57) ABSTRACT

An interconnection device has a substrate that includes a conductive trace having an exposed portion at an edge of the substrate. The exposed portion is tapered toward the edge of the substrate. The exposed portion is provided for direct physical contact with a second conductive trace exposed at an edge of a second substrate. A high frequency direct electrical interconnection is thereby provided that reduces the disadvantageous effects of lateral, longitudinal, and co-planar misalignment between the conductive traces.

5 Claims, 10 Drawing Sheets

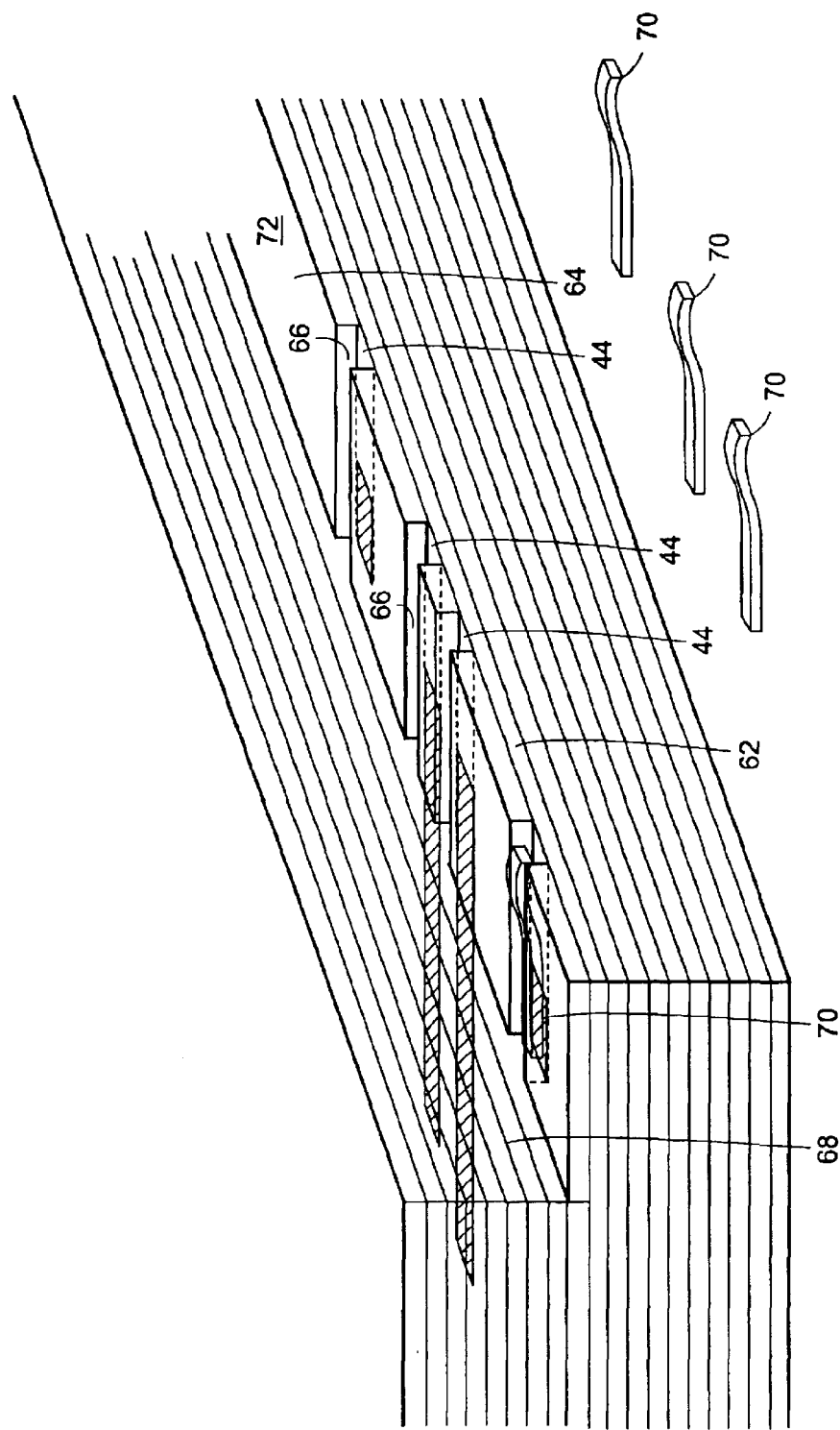

SIGNAL LAYER INTERCONNECT USING TAPERED TRACES

CROSS-REFERENCE TO RELATED APPLICATIONS

A claim of priority is made to U.S. Provisional Patent Application No. 60/324,328, entitled Small Form-Factor Pluggable Connection of High Frequency and Low Frequency Signals between Substrates, by Martin R. Handforth, et al., filed Sep. 24, 2001, which is incorporated by reference.

This patent application may be related to the following commonly-owned United States patent application, which is incorporated in its entirety by reference:

U.S. patent application entitled SIGNAL LAYER INTERCONNECTS, Ser. No. 09/821,722, by Martin R. Handforth et al., filed Mar. 29, 2001.

FIELD OF THE INVENTION

The present invention relates generally to electrical connectors, and more particularly to electrical interconnect technology for high frequency transmission.

BACKGROUND OF THE INVENTION

Impedance matching problems associated with use of mechanical connectors for connecting conductive traces are known. For example, the present state of the art in electrical connector technology involves the use of vias, which are holes plated with metal, to connect signal layers in multi-layer substrates. When used with high-frequency signals such as digital signals, vias contribute to problems such as impedance mismatches and cross-talk to adjacent signal layers. The extent of the problem depends upon the type of via used and related size and material characteristics.

The high frequency performance of vias depends mainly on a number of geometric features such as length of the plated-through hole, and diameter of the plated-through hole. The high frequency performance of vias further depends on the dielectric constant of the substrate dielectric layers. Other features that impact the high frequency performance of vias include the number, size, and shape of metallic pads used on the via and the number, size, and shape of the clearance holes, also called antipads, used where the plated-through hole must penetrate the metal reference planes (e.g., ground or power planes).

In view of the foregoing, it would be desirable to provide a technique for connecting signal layers in a multi-layer substrate which overcomes the above-described inadequacies and shortcomings. More particularly, it would be desirable to provide a technique for connecting signal layers and avoiding impedance mismatching in an efficient and cost effective manner.

SUMMARY OF THE INVENTION

In accordance with the principles of the invention, there is provided an interconnection device having a substrate that includes a conductive trace having an exposed portion at an edge of the substrate. The exposed portion is tapered toward the edge of the substrate. The exposed portion is provided for direct physical contact with a second conductive trace exposed at an edge of a second substrate. In accordance with a further aspect of the invention, the exposed portion of the conductive trace can contain a widened portion at the edge of the substrate.

Further in accordance with the principles of the invention, there is provided an electronic assembly. The assembly includes a first substrate that includes a first conductive trace having an exposed portion at an edge of the first substrate. The exposed portion of the first conductive trace is tapered toward the edge of the first substrate. The assembly further includes a second substrate that includes a second conductive trace having an exposed portion at an edge of the second substrate. The exposed portion of the second conductive trace is tapered toward the edge of the second substrate. The first substrate and said second substrate can be brought into contact such that the exposed portion of the first conductive trace is in direct physical contact with the exposed portion of the second conductive trace.

According to an aspect of the invention, the second conductive trace is oriented on the second substrate such that when the first and second substrates are brought into contact, the exposed portion of the first conductive trace is in direct physical contact with the exposed portion of the second conductive trace, and the second conductive trace is laterally offset from the first conductive trace and overlapping the first conductive trace.

According to a further aspect of the invention, a first substrate has a first substrate layer that includes a tapered trace. The first substrate layer is disposed below other substrate layers, wherein substrate material residing above the tapered trace is removed from the other substrate layers thereby forming a channel in the other substrate layers. The tapered trace resides within the channel. A resilient conducting member is disposed upon the tapered trace. A second substrate that includes a second tapered trace can be brought into contact with the first substrate such that the resilient conducting member is in direct physical contact with the exposed portion of the second tapered trace.

The various aspects of the invention are advantageously used to provide a high frequency direct electrical interconnection is thereby that minimizes the effects of lateral, longitudinal, and co-planar misalignment between the conductive traces.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

FIG. 10 is a perspective view of another aspect of the invention wherein the tapered traces are disposed within channels on the substrate.

DETAILED DESCRIPTION OF EXEMPLARY EMBODIMENTS

Co-pending patent application Ser. No. 09/821,722, incorporated by reference herein, describes an interconnect technology that is advantageously used for the transmission of high frequency electrical signals. High frequency signal traces are exposed on their respective substrates, and a direct electrical connection is provided when the traces are placed in direct contact with one another. Various problems associated with known interconnect technologies, such as impedance mismatches and cross-talk, are thereby minimized.

Figure 1:
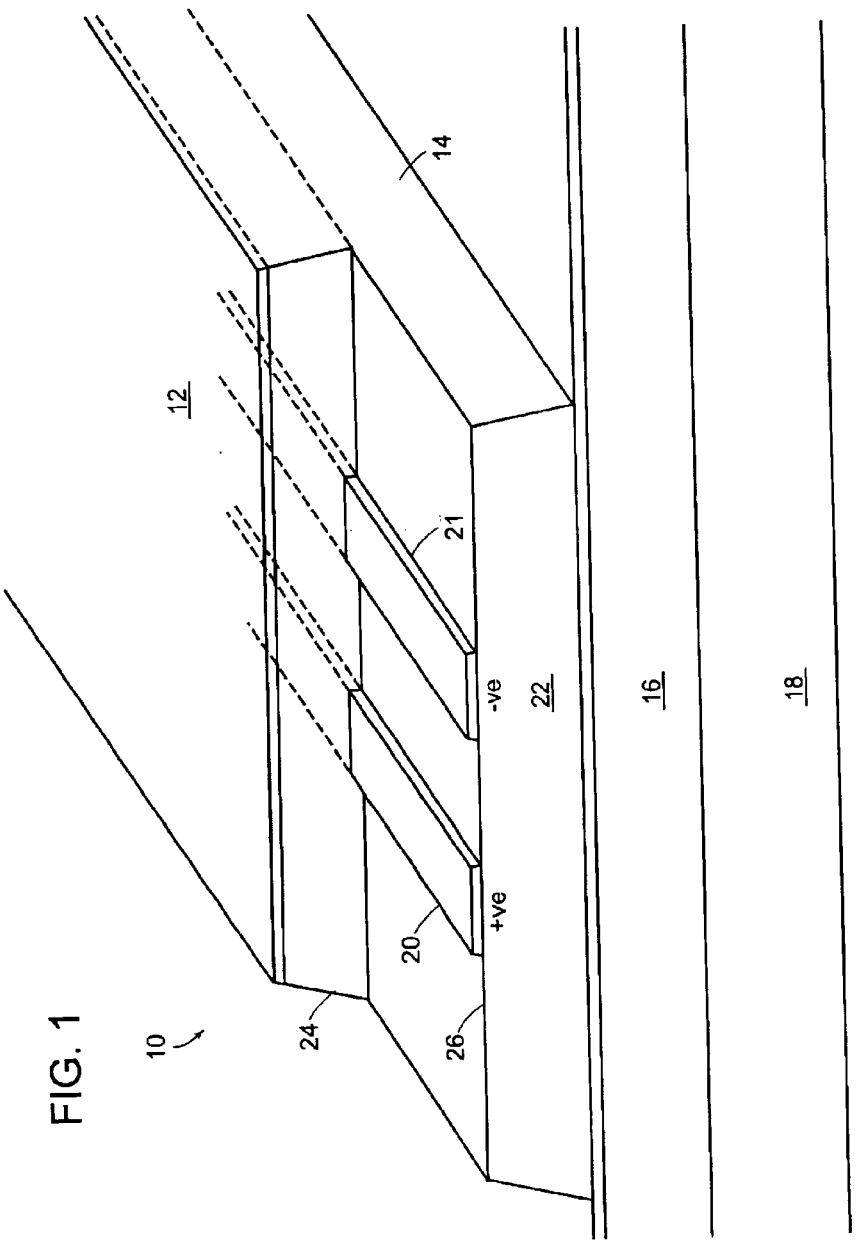
FIG. 1 is a perspective view of a substrate having exposed signal layer traces.

Referring to FIG. 1, a substrate 10 with direct signal layer interconnect capability has multiple layers, including outer layer 12 and inner layers 14, 16, 18. Each layer includes a dielectric portion and a conductive portion. For example, substantially flat conductive copper traces 20, 21 are disposed on dielectric substrate material 22, such as FR4, ceramic, or other materials. Each inner layer is generally dedicated to a single function, such as carrying ground, power or signals. Signal layer traces are formed in various widths to optimize density and impedance matching.

Portions of selected signal layer traces 20, 21 are made directly accessible in order to facilitate electrical connection. In the illustrated example, one end of some of the signal layer traces 20, 21 is exposed by removing the surrounding dielectric substrate material 24 associated with the outer layer 12. The selected signal layer traces 20, 21 terminate near the edge 26 of the substrate and are substantially orthogonal to the edge of the substrate, although any angle could be accommodated. Each exposed trace 20, 21 presents a substantially flat conductive surface near the edge of the substrate.

Figure 2:
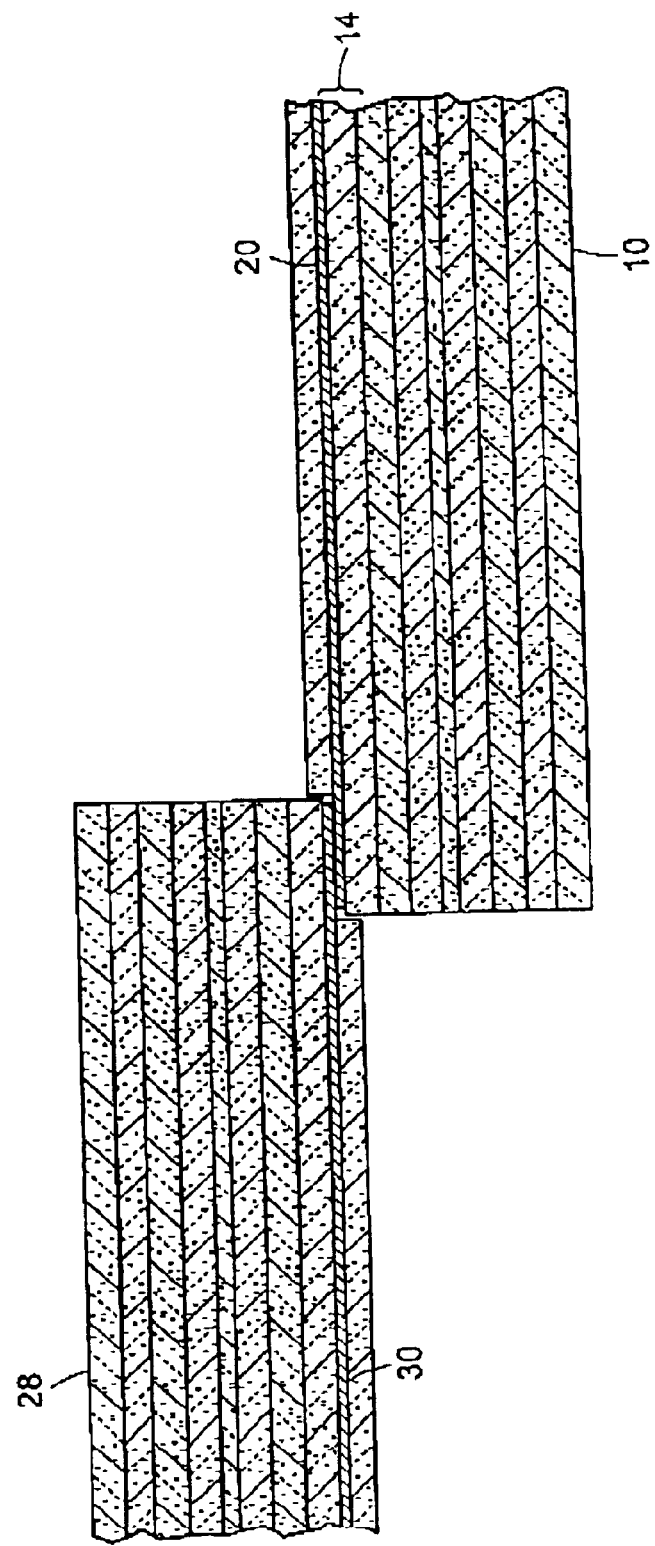
FIG. 2 is a side view of the substrate of FIG. 1 connected with another substrate.

Referring to FIG. 2, electrical connection is established by placing at least a portion of the flat surface of exposed traces 20, 21 (21 not illustrated) in physical contact with corresponding conductors associated with another device. For example, a second substrate 28 with corresponding exposed signal layer traces 30 (other trace not illustrated) may be aligned with and secured against the substrate 10 such that the flat surfaces of the traces, e.g., traces 20 and 30, are maintained in physical contact with one another.

Figure 3:
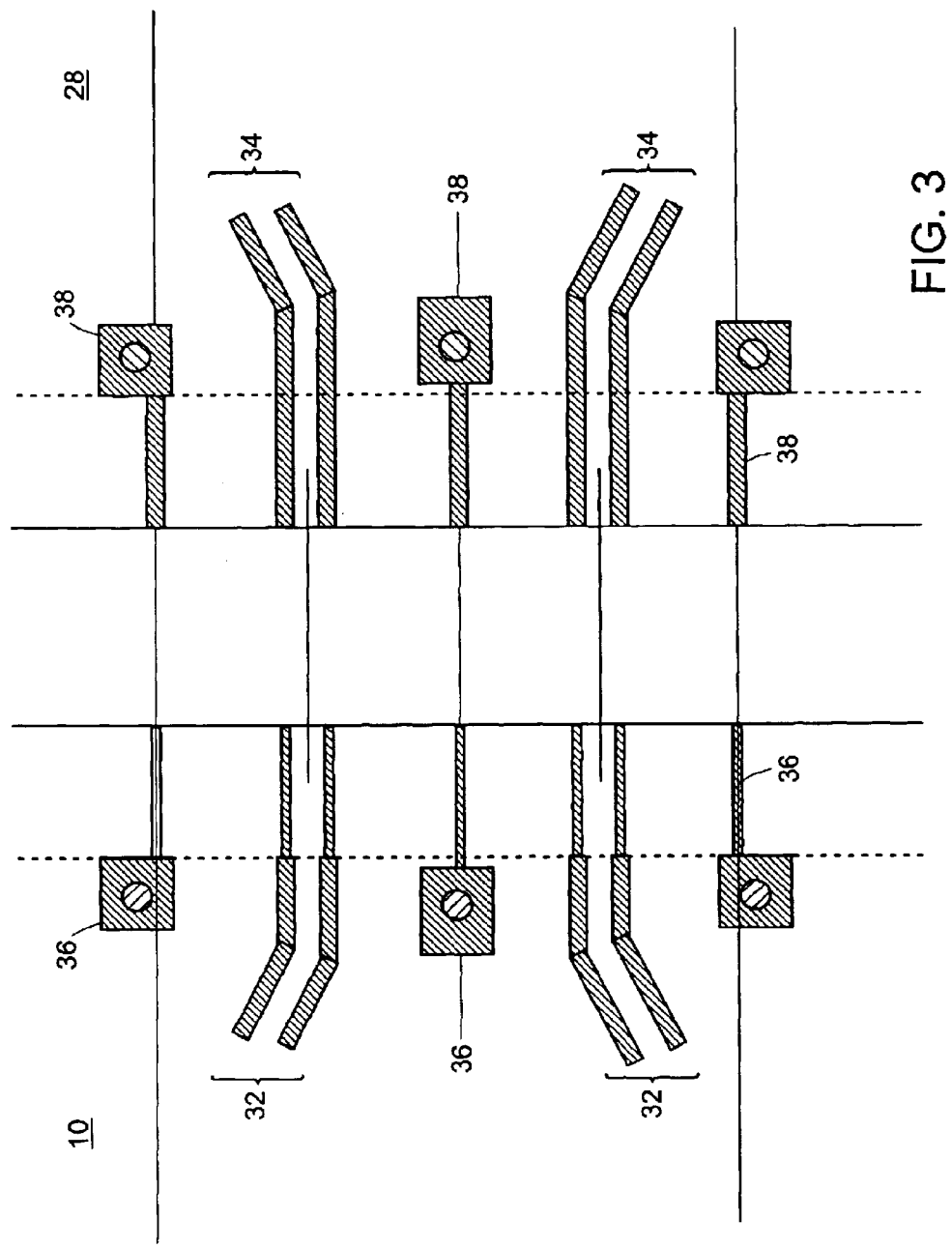
FIG. 3 is an overhead view of two substrates having exposed signal layer traces.

In FIG. 3, traces 20 and 30 are shown in more detail. Traces 20 and 30 may include, for example, differential signal pairs 32 and 34, and ground traces 36 and 38. When the substrates 28 and 10 are brought into contact, direct electrical connection is established between the differential signal pair traces 32 and 34 and the ground traces 36 and 38. In the example shown, each trace constituting the differential pair traces 32 and 34 and the ground traces 36 and 38 is in the range of three to eight mils wide. Though differential signal pairs are shown, the invention is equally applicable to single ended signal traces, and is advantageously employed in any environment where impedance controlled electrical connections are required.

Figure 4:
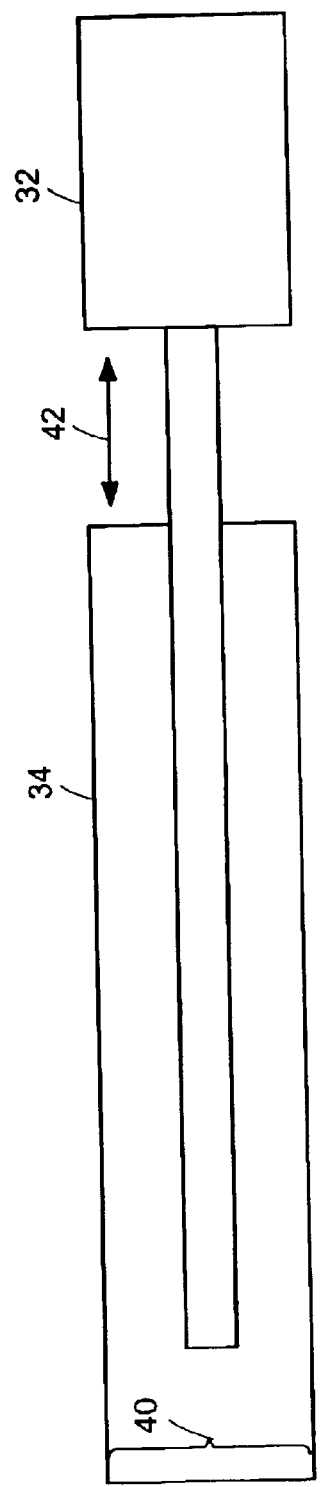
FIG. 4 is an overhead view of exposed signal layer traces being brought into contact for electrical interconnection, wherein the exposed portion of one trace is narrower than the exposed portion of the other trace and some longitudinal misalignment is present.

The exposed portions of the differential signal pair traces 34 and ground traces 38 on substrate 28 can be seen to be wider than the exposed portions of the differential signal pair traces 32 and ground traces 36 on substrate 10. In FIG. 4, it can be seen that such a geometry allows for a certain amount of lateral misalignment 40, for example about 1.5 mils with the trace widths as shown herein, when establishing the direct electrical interconnection. However, a certain amount of longitudinal misalignment 42 may also occur during establishment of the direct electrical interconnection. The longitudinal misalignment as shown in FIG. 4 can result in undesirable impedance mismatches between the traces 32 and 34. For example, longitudinal misalignment may cause a high impedence discontinuity where the narrow exposed portion of the track 32 appears in series with the track 34.

Figure 5:
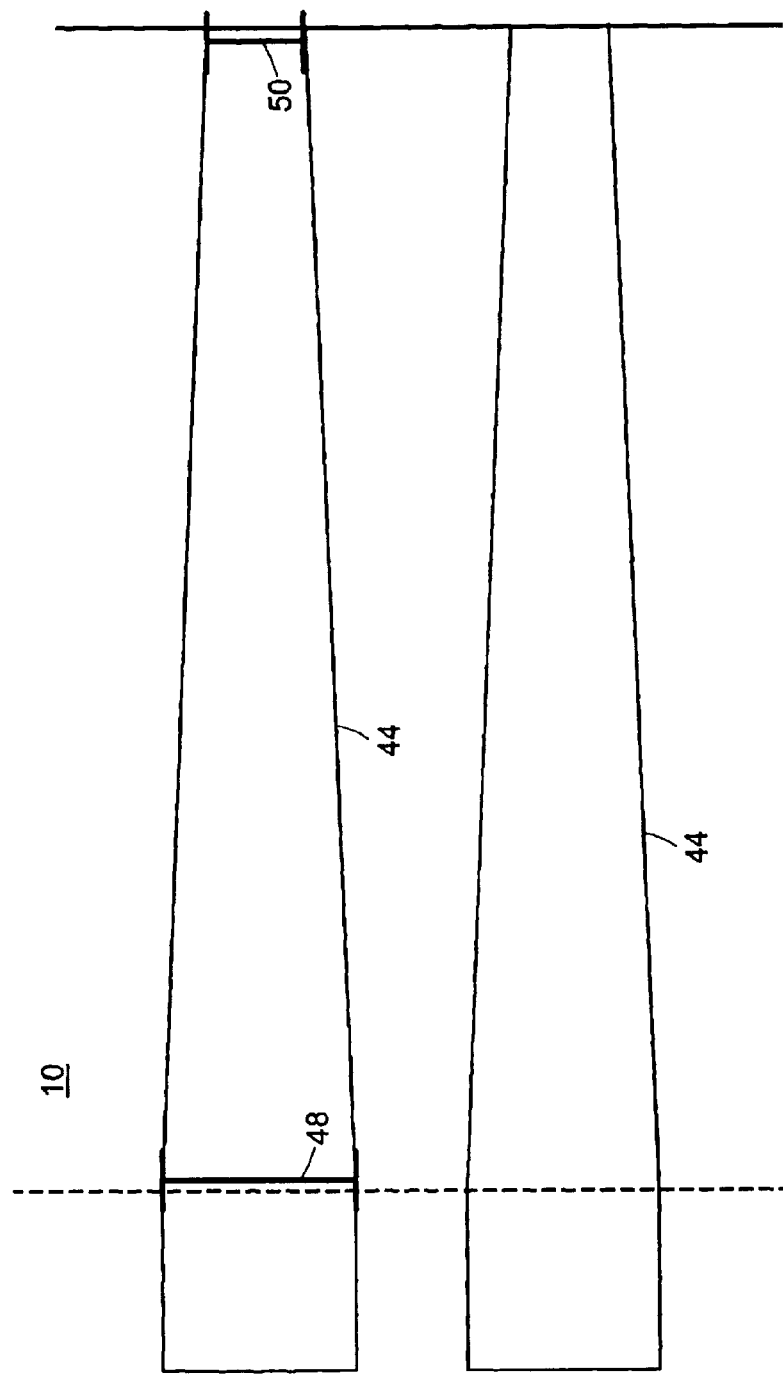
FIG. 5 is an overhead view of a pair of signal layer traces whose exposed portions are tapered.

An improved signal trace geometry is shown in FIG. 5. Traces 44 are exposed for direct electrical interconnection on the substrate 10 in the same manner as described for the traces 20 and 30. Traces 44 may be ground traces such as traces 36 of FIG. 3, or may be differential signal pair traces such as traces 32 of FIG. 3, or may be any other type of trace. Traces 44 are shown to be tapered from a widest point 48 on the substrate from which the signal traces 44 have been exposed for direct electrical connection, to a narrowest point 50 on the edge of the substrate 10. The widest point 48 may be for example approximately 6.5 mils, and the narrowest point 50 may be for example approximately 3 mils. These dimensions are provided by example only, as a skilled artisan will understand that many possible dimensions will provide advantageous results.

Figure 6:
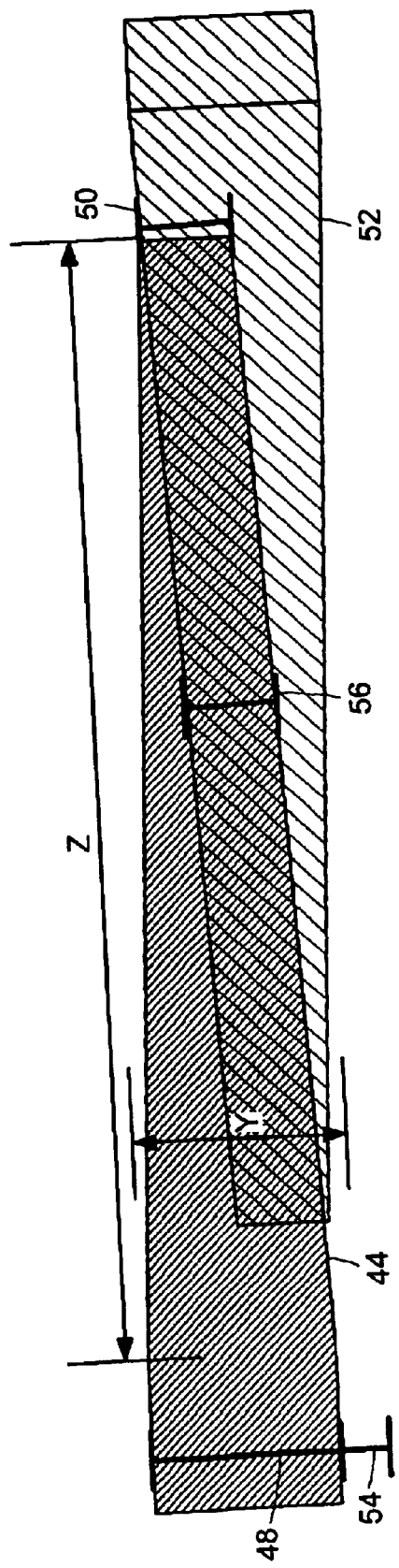
FIG. 6 is an overhead view of a pair of tapered signal layer traces being brought into contact for electrical interconnection.

Referring now to FIG. 6, a trace 52 on the substrate 28 is shown to be tapered in the same manner. The tapered trace 52 on the substrate 28 is positioned such that when the substrates 10 and 28 are brought together for direct electrical interconnection of the traces 44 and 52, the traces 44 and 52 are offset by a small distance 54.

When substrates 10 and 28 are brought together for direct electrical interconnection of the traces 44 and 52 as shown in FIG. 6, the tapered trace 44 overlaps with the tapered trace 52 in such a way that longitudinal misalignment tolerances are substantially improved. The lateral misalignment tolerance, i.e. the degree of misalignment in the "y" direction as shown, is substantially the same as was shown in FIG. 4. The longitudinal misalignment, i.e. the degree of misalignment in the "z" direction as shown, is improved due to the tapered geometry of the traces 44 and 52. As the traces 44 and 52 are moved in the "z" direction, a substantially constant width overlap 56 is maintained. The width of the overlap 56 is substantially similar to the width of the narrow point 50 of the traces 44 and 52. Thus, a certain degree of longitudinal misalignment can be tolerated while a substantially constant impedance is maintained across the connection. In the present example, a longitudinal misalignment of approximately 20–30 mils can be tolerated.

Figure 7:
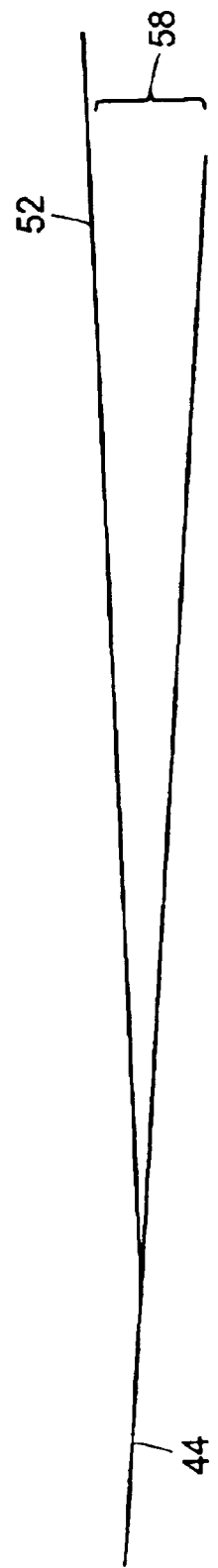
FIG. 7 is a side view of the tapered traces of FIG. 6 wherein some coplanar misalignment is present.

Referring to FIG. 7, which shows a side view of the traces 44 and 52, it can be seen that the effects of co-planar misalignment 58 are also improved with the provision of the tapered traces 44 and 52. Such co-planar misalignment between the traces as shown in FIG. 4 causes the trace 32 to act as a high impedance stub, resulting in substantial signal reflections. Because of the substantial overlap provided between the traces 44 and 52, impedance mismatches due to co-planar misalignment are minimized.

Figure 8:
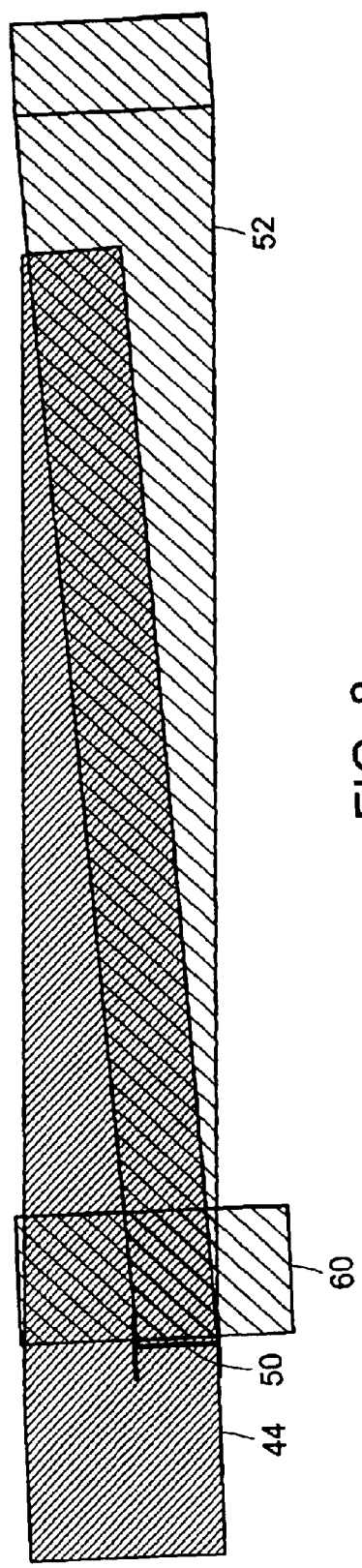
FIG. 8 is an overhead view of an alternate embodiment of the tapered traces shown in FIG. 6.

Referring to FIG. 8, trace 52 is shown to have a widened portion 60 in the form of a T-shaped protrusion at its narrowest point 50. The widened portion 60 can provide for greater robustness and contact area, while contributing negligible deleterious impedance effects. The widened portion 60 is advantageous in that the greater contact area provides for better wearing of contact points.

Figure 9:
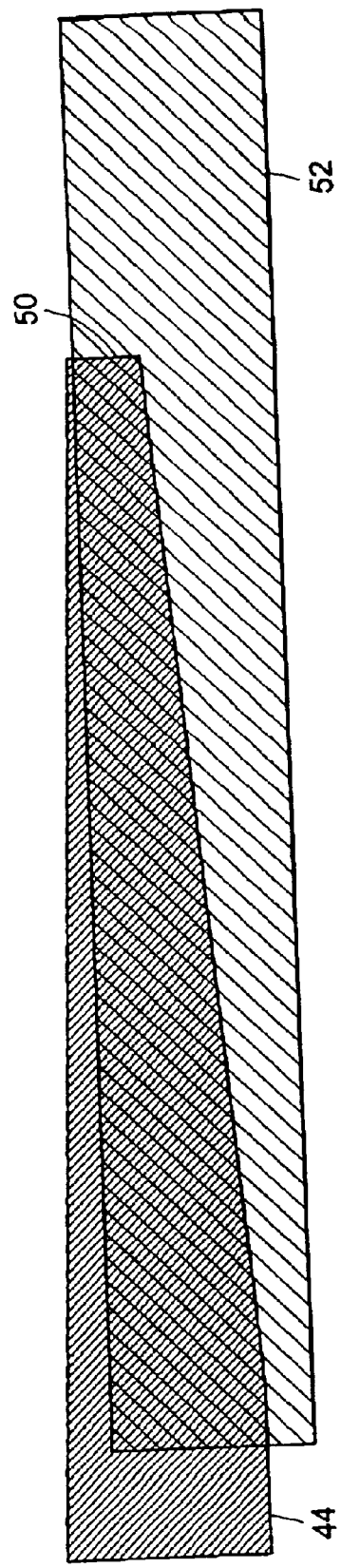
FIG. 9 is an overhead view of an alternate embodiment of the tapered traces shown in FIG. 6 wherein only one of the traces is tapered.

Referring to FIG. 9, in accordance with an alternate embodiment of the invention, only the traces 44 are tapered, while the trace 52 is not.

In FIG. 10, there is shown another mechanism for improving the quality of the direct electrical interconnection. As shown herein, the high frequency tapered signal traces 44 reside within channels 66. The tapered traces 44 reside on an exposed substrate layer 62, while material has been removed from the substrate layer 64 above the layer 62 such that channels 66 are formed and such that the signal traces 44 reside on the floors of the channels. The upper substrate layers 68 have been removed above the channels 66 such that the signal traces 44 within the channels 66 are exposed for direct electrical interconnection with corresponding signal traces such as on the substrate 28. The channels 66 may be formed such that the channels are the same width as the widest portions of the tapered traces 44, or are wider than the tapered traces 44. The walls of the channels may be perpendicular to the plane of the substrate layer 62 or may be disposed at an angle, and may be straight or curved.

Also shown are resilient conductive members 70, herein embodied as leaf springs. The resilient conductive members 70 are bonded to the exposed signal traces 44, for example by soldering or welding. The resilient conductive members 70 may initially be part of a busbar assembly. The busbar assembly is aligned with the substrate 10 such that the resilient conductive members 70 are aligned with the signal traces 44. The resilient conductive members 70 are then welded or soldered to the traces 44, preferably in a single operation, and then the busbar is cut off, leaving an individual resilient conductive member 70 on each trace 44. Alternatively, individual resilient contact members 70 can be placed on each trace 44, for example by hand or by pick-and-place machine.

Once attached to the signal traces 44, the resilient conductors 70 protrude slightly above the top surface 72 of the layer 64, for example by about 5 mils. When the substrate 10 is brought together with the substrate 28, the resilient conductive members 70 will resiliently contact exposed tapered traces 52 to form the direct electrical interconnection. The resiliency of the conductive members 70 provides reliable electrical interconnections between each corresponding signal trace 44 and 52 despite any warping or deformations that may exist in the substrates 10 or 28.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breadth and spirit of the present invention as disclosed herein.

We claim:

1. An interconnection device comprising:

a first substrate that includes a first conductive trace having at least one exposed portion at an edge of the substrate, the exposed portion being tapered narrowingly in width toward the edge of the first substrate, the exposed portion for direct physical contact with a second conductive trace exposed at an edge of a second substrate.

2. An electronic assembly comprising:

a firs substrate that includes a first conductive trace having at least one exposed portion at an edge of the first substrate, said exposed portion being tapered narrowingly in width toward the edge of the first substrate;

a second substrate that includes a second conductive trace having least one exposed portion at an edge of the second substrate, said exposed portion being tapered narrowingly in width toward the edge of the second substrate;

wherein said first substrate and said second substrate can be brought into contact such that the exposed portion of the fir conductive trace is in direct physical contact with the exposed portion of the second conductive trace.

3. The electronic assembly of claim 2 wherein the second conductive trace is oriented on the second substrate such that when the first and second substrates are brought into contact so that the exposed portion of the first conductive trace is in direct physical contact with the exposed portion of the second conductive trace, the second conductive trace is partially laterally offset from the first conductive trace and overlapping the first conductive trace.

4. The electronic assembly of claim 3 wherein one of the first or second conductive traces contains a widened portion at the edge of the respective first or second substrate.

5. An electronic assembly comprising:

a first substrate having a first substrate layer that includes a first conductive trace having at least one exposed portion at an edge of the first substrate layer, said exposed portion being tapered narrowingly in width toward the edge of the first substrate layer, said first substrate layer being disposed below at least one other substrate layer, wherein substrate material residing above the conductive trace is removed from the at least one other substrate layer thereby forming a channel in the other substrate layers, the conductive trace residing within the channel;

a resilient conducting member disposed upon the conductive trace;

a second substrate that includes a second conductive trace having at least one exposed portion at a edge of the second substrate, said exposed portion being tapered narrowingly in width toward the edge of the second substrate;

wherein said first substrate and said second substrate can be brought into contact such that the resilient conducting member is in direct physical contact with the exposed portion of the second conductive trace.

* * * * *